US012800622B2

(12) United States Patent
Kim et al.

(10) Patent No.: US 12,800,622 B2
(45) Date of Patent: Nov. 17, 2026

(54) ELECTRONIC DEVICE AND VOLTAGE DETECTION METHOD THEREOF

(71) Applicant: Samsung Electronics Co., Ltd., Suwon-si (KR)

(72) Inventors: Boram Kim, Suwon-si (KR); Younggon Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 19/012,554

(22) Filed: Jan. 7, 2025

(65) Prior Publication Data

US 2025/0147080 A1 May 8, 2025

Related U.S. Application Data

(63) Continuation of application No. PCT/KR2023/009042, filed on Jun. 28, 2023.

(30) Foreign Application Priority Data

Aug. 10, 2022 (KR) ........................ 10-2022-0099738

(51) Int. Cl.
*G01R 19/165* (2006.01)

(52) U.S. Cl.
CPC .............................. *G01R 19/16576* (2013.01)

(58) Field of Classification Search
None
See application file for complete search history.

(56) References Cited

U.S. PATENT DOCUMENTS 5,552,736 A 9/1996 Desroches
5,886,567 A 3/1999 Park et al.
(Continued)

FOREIGN PATENT DOCUMENTS

JP 2014020796 A 2/2014
JP 2021136559 A 9/2021
(Continued)

OTHER PUBLICATIONS

Extended European Search Report dated Sep. 5, 2025 issued in European Patent Application No. 23852737.8.
(Continued)

*Primary Examiner* — Giovanni Astacio-Oquendo
*Assistant Examiner* — Carl F. R. Tchatchouang
(74) *Attorney, Agent, or Firm* — Nixon & Vanderhye, P.C.

(57) ABSTRACT

An electronic device is disclosed. The electronic device includes: a power detection IC which, based on abnormality of at least one voltage among multiple voltages being detected, outputs a detection signal having a specified level, and at least one processor, comprising processing circuitry, individually and/or collectively, configured to perform an operation corresponding to the level of a detection signal output from the power detection IC, wherein the multiple voltages include a first voltage and a second voltage, at least one of multiple input ends of the power detection IC is in common connection with a first resistance to which the first voltage is applied and a switching element comprising a switch connected to a second resistance to which the second voltage is applied, and based on the switching element being turned on based on the second voltage and a reference voltage applied to the switching element, the power detection IC is configured to compare the second voltage applied (Continued)

to the at least one input end with a threshold voltage to detect whether the second voltage is abnormal.

14 Claims, 6 Drawing Sheets

(56) References Cited

U.S. PATENT DOCUMENTS

| | | | | |
|---|---|---|---|---|
| 9,960,615 | B2 | 5/2018 | Yoon et al. | |
| 10,094,859 | B1 | 10/2018 | Rao et al. | |
| 10,451,659 | B2 * | 10/2019 | Chang | G01R 19/16576 |
| 10,719,095 | B2 | 7/2020 | Jeong | |
| 11,316,514 | B2 | 4/2022 | Ideno | |
| 2014/0184184 | A1 | 7/2014 | Yajima et al. | |
| 2016/0033984 | A1 | 2/2016 | Lee | |
| 2019/0146018 | A1 * | 5/2019 | Nakamura | G01R 27/14 324/713 |

FOREIGN PATENT DOCUMENTS

| | | | |
|---|---|---|---|
| KR | 910006505 | A | 4/1991 |
| KR | 960038400 | A | 11/1996 |
| KR | 19980027242 | A | 7/1998 |
| KR | 100313512 | B1 | 11/2001 |
| KR | 20070066274 | A | 6/2007 |
| KR | 20120074105 | A | 7/2012 |
| KR | 101539579 | B1 | 8/2015 |
| KR | 20150098381 | A | 8/2015 |
| KR | 20160014455 | A | 2/2016 |
| KR | 101904814 | B1 | 10/2018 |
| KR | 20190142535 | A | 12/2019 |
| WO | 2006/025018 | | 3/2006 |
| WO | 2013042285 | A1 | 3/2013 |

OTHER PUBLICATIONS

Maxim, "Microprocessor Voltage Monitor with Dual Over/Undervoltage Detection", 2015, 12 pages.

International Search Report for PCT/KR2023/009042 mailed Oct. 12, 2023, 4 pages with English translation.

Written Opinion of the ISA for PCT/KR2023/009042 mailed Oct. 12, 2023, 3 pages.

* cited by examiner

ELECTRONIC DEVICE AND VOLTAGE DETECTION METHOD THEREOF

CROSS-REFERENCE TO RELATED APPLICATIONS

This application is a continuation of International Application No. PCT/KR2023/009042 designating the United States, filed on Jun. 28, 2023, in the Korean Intellectual Property Receiving Office and claiming priority to Korean Patent Application No. 10-2022-0099738, filed on Aug. 10, 2022, in the Korean Intellectual Property Office, the disclosures of each of which are incorporated by reference herein in their entireties.

BACKGROUND

Field

The disclosure relates to an electronic device and a voltage detection method thereof and for example, to an electronic device detecting a voltage and a voltage detection method thereof.

Description of Related Art

An electronic device provides a voltage of a constant magnitude to various components included in the electronic device to drive the electronic device. Accordingly, if the voltage of the constant magnitude is not provided, the electronic device may be not normally driven.

Therefore, the electronic device detects a voltage used for driving the electronic device using a power detection IC. For example, if an electronic device is implemented as a TV, the electronic device may detect whether the constant voltage is provided for driving each component to various components such as a display panel, an amplifier, etc.

SUMMARY

Embodiments of the disclosure provide an electronic device detecting whether a plurality of voltages are abnormal through one input end of the power detection IC using an additional circuit and a power detection method thereof.

According to an example embodiment of the disclosure an electronic device includes: a power detection integrated circuit (IC) configured to output a detection signal having a specified level based on abnormality of at least one voltage of a plurality of voltages being detected, and at least one processor, comprising processing circuitry, individually and/or collectively, configured to perform an operation corresponding to a level of the detection signal output from the power detection IC, wherein the plurality of voltages include a first voltage and a second voltage, wherein at least one of a plurality of input ends of the power detection IC is commonly connected to a first resistance to which the first voltage is applied and a switching element comprising a switch connected to a second resistance to which the second voltage is applied, and wherein based on the switching element being turned on based on the second voltage and a reference voltage applied to the switching element, the power detection IC is configured to compare the second voltage applied to the at least one input end to a threshold value to detect whether the second voltage is abnormal.

The first voltage may be applied to one end of the first resistance, the second voltage may be applied to one end of the second resistance, and a first end of the switching element may be connected to the other end of the second resistance, a second end of the switching element may receive the reference voltage, and a third end of the switching element may be commonly connected to the other end of the first resistance and the at least one input end.

The power detection IC may output the detection signal of the specified level based on the first voltage being less than the threshold voltage.

The switching element may be turned on based on the second voltage being less than the reference voltage.

The power detection IC may be configured to output the detection signal of the specified level based on the second voltage being less than the threshold voltage.

Each of the plurality of input ends may be commonly connected to the first resistance to which the first voltage is applied and the switching element connected to the second resistance to which the second voltage is applied, and based on the switching element being turned on based on the second voltage and the reference voltage applied to the switching element, the power detection IC may be configured to compare the second voltage applied to the plurality of input ends to a threshold value to detect whether the second voltage is abnormal.

Each of the plurality of voltages may be used for driving the electronic device.

According to an example embodiment of the disclosure, a method of detecting a voltage of an electronic device includes: outputting a detection signal having a specified level by a power detection IC based on abnormality of at least one voltage of a plurality of voltages being detected by the power detection IC, and performing an operation corresponding to a level of the detection signal output from the power detection IC, wherein the plurality of voltages include a first voltage and a second voltage, wherein at least one of a plurality of input ends of the power detection IC is commonly connected to the first resistance to which the first voltage is applied and a switching element, comprising a switch, connected to a second resistance to which the second voltage is applied, and wherein based on the switching element being turned on based on the second voltage and a reference voltage applied to the switching element, the outputting compares the second voltage applied to the at least one input end to a threshold value to detect whether the second voltage is abnormal.

The first voltage may be applied to one end of the first resistance, the second voltage may be applied to one end of the second resistance, and a first end of the switching element may be connected to the other end of the second resistance, a second end of the switching element may receive the reference voltage, and a third end of the switching element may be commonly connected to the other end of the first resistance and the at least one input end.

The outputting may include outputting the detection signal of the specified level based on the first voltage being less than the threshold voltage.

The switching element may be turned on based on the second voltage being less than the reference voltage.

The outputting may include outputting the detection signal of the specified level based on the second voltage being less than the threshold voltage.

Each of a plurality of input ends may be commonly connected to the first resistance to which the first voltage is applied and a switching element connected to the second resistance to which the second voltage is applied, and based on the switching element being turned on based on the second voltage and the reference voltage applied to the switching element, the outputting may compare the second voltage applied to the plurality of input ends to a threshold value and may detect whether the second voltage is abnormal.

Each of the plurality of voltages may be used for driving the electronic device.

According to various example embodiments of the disclosure, whether an additional voltage is abnormal may be detected without increasing the number of detection circuit ICs, thereby reducing costs.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
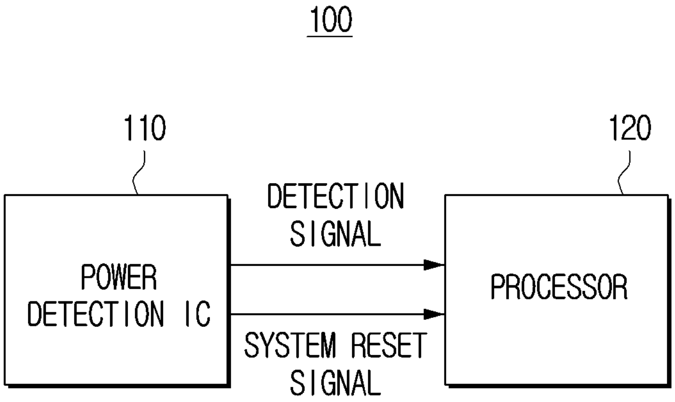
FIG. 1 is a block diagram illustrating an example configuration of an electronic device according to various embodiments.

Embodiments of the disclosure may be modified in various different forms and may have various embodiments, wherein various example embodiments will be illustrated in the drawings and explained in the detailed description. However, it should be noted that the various embodiments are not for limiting the scope of the disclosure to a specific embodiment but they should be interpreted to include all modifications, equivalents, and/or alternatives of the various embodiments of the disclosure. With respect to the detailed description of the drawings, similar components may be designated by similar reference numerals.

In case it is determined that in describing the disclosure, the detailed description of related known functions or configurations may unnecessarily confuse the gist of the disclosure, the detailed description may be omitted.

In addition, the various embodiments below may be modified in various different forms, and the scope of the technical spirit of the disclosure is not limited to the various example embodiments below. Rather, these example embodiments are provided to make the disclosure more sufficient and complete.

The terms used in the disclosure are used simply to explain various example embodiments, and are not intended to limit the scope of the disclosure. Singular expressions include plural expressions, unless clearly differently defined in the context.

In the disclosure, the expression such as "have," "may have," "include" or "may include" denote the existence of such characteristics (e.g. numerical values, functions, operations, and components such as parts) and the expression does not exclude the existence of additional characteristics.

In the disclosure, the expression "A or B," "at least one of A and/or B,", "one or more of A and/or B", or the like may include all possible combinations of the listed items. For example, "A or B," "at least one of A and B," or "at least one of A or B" may refer to all of the following cases: (1) including at least one A, (2) including at least one B, or (3) including all of at least one A and at least one B.

The expressions "1st", "2nd", "first", "second", or the like used in the disclosure may be used to describe various elements regardless of any order and/or degree of importance, wherein such expressions are used only to distinguish one element from another element and are not intended to limit the elements.

A description that one element (e.g. a first element) is "(operatively or communicatively) coupled with/to" or "connected to" another element (e.g. a second element) should be interpreted to include both the case where the one element is directly coupled to the another element and the case where the one element is coupled to the another element through the other element (e.g.: a third element).

A description that one element (e.g. a first element) is "directly coupled" or "directly connected" to another element (e.g. a second element) may be interpreted to refer, for example, to the other element (e.g. a third element) not being present between one element and another element.

The expression "configured to (or set to)" used in the disclosure may be interchangeably used with other expressions, for example, "suitable for", "having the capacity to", "designed to", "adapted to", "made to", or "capable of" depending on circumstances. The term "configured to (or set to)" may not necessarily refer to a device being "specifically designed to" in terms of hardware.

Under some circumstances, the expression "a device configured to" may refer, for example, to the device "is capable of" performing an operation together with another device or component. For example, the phrase "a processor configured to (set to) perform A, B, and C" may refer, for example, to a dedicated processor for performing the corresponding operations (e.g. an embedded processor), or a generic-purpose processor that may perform the corresponding operations by executing one or more software programs stored in a memory device (e.g.: a CPU or an application processor).

In various embodiments of the disclosure, a 'module' or 'part' may perform at least one function or operation and may be implemented as hardware or software, or as a combination of hardware and software. In addition, a plurality of 'modules' or 'parts' may be integrated into at least one module and implemented as at least one processor, excluding 'module' or 'part' that needs to be implemented as specific hardware.

Various elements and areas in the drawings were illustrated schematically. Accordingly, the technical spirit of the disclosure is not limited by the relative sizes or intervals illustrated in the appended drawings.

Hereinafter, with reference to the appended drawings, various example according to the disclosure are described in greater detail.

FIG. 1 is a block diagram illustrating an example configuration and operation of an electronic device according to various embodiments.

With reference to FIG. 1, an electronic device 100 according to an embodiment of the disclosure includes a power detection integrated circuit (IC) 110 and a processor (e.g., including processing circuitry) 120.

The electronic device 100 may be implemented as various types of electronic devices such as, for example, and without limitation, a TV, a smart phone, a tablet PC, a desktop PC, a laptop PC, an IoT device, or the like.

The power detection IC 110 may detect whether a voltage is abnormal. The voltage may refer, for example, to a voltage used for driving the electronic device 100 and may include a voltage provided to various components included in the electronic device 100. For example, the voltage may include a reference voltage for generating a voltage for driving a display panel of the electronic device 100, a voltage for driving an amplifier for generating sound, a voltage for driving a core inside a main IC and a CPU/GPU, a voltage for DDR communication, a reference voltage for I/O communication, a voltage used for a USB and an internal IP block.

For the above, the power detection IC 110 may include a plurality of input ends. The input ends may be a port into which a voltage is input. For example, the power detection IC 110 may detect whether a voltage applied to each of a plurality of input ends is abnormal. For example, the power detection IC 110 may include three input ends. However, it is merely an example, wherein the number of input ends may be more or fewer than three according to a specification of the power detection IC 110.

That abnormality occurs in a voltage may refer, for example, to there being abnormality in a power source proving a voltage or a magnitude of a voltage is lowered due to other problems.

The power detection IC 110 may output a detection signal. For example, the power detection IC 110 may detect a magnitude of a voltage and output a detection signal corresponding thereto. For example, the power detection IC 110, if it detects that there is no abnormality of the voltage based on the magnitude of the voltage (e.g., if it detects that the voltage is constantly maintained), may output a detection signal having a first level. The first level may be a high level. The power detection IC 110, if it detects that there is abnormality of the voltage based on the magnitude of the voltage (e.g., if it detects that the voltage is lowered), may output a detection signal having a second level. Here, the second level may be a low level. In the aforementioned embodiment, it is described that the first level and the second level are high and low, respectively but it is merely an example, wherein the first and second levels may be low and high, respectively.

The power detection IC 110 may output a system reset signal. For example, the power detection IC 110 may receive a voltage VDD for driving the power detection IC 110. In this case, the power detection IC 110 may detect a magnitude of the voltage VDD for driving the power detection IC 110 and output a system reset signal corresponding thereto. For example, the power detection IC 110, if it detects that there is no abnormality of the relevant voltage based on the magnitude of the voltage VDD for driving the power detection IC 110 (e.g., if the voltage VDD for driving the power detection IC 110 is a preset (e.g., specified) magnitude or more), may output a system reset signal having the first level. The first level may be a high level. The power detection IC 110, if it detects that there is abnormality of the relevant voltage based on the magnitude of the voltage VDD for driving the power detection IC 110 (e.g., if the voltage VDD for driving the power detection IC 110 is less than the preset magnitude), may output a system reset signal having the second level. The second level may be a low level. In the aforementioned embodiment, it is described that the first level and the second level are high and low, respectively but it is merely an example, wherein the first and second levels may be low and high, respectively.

The processor 120 may include various processing circuitry and controls operations of the electronic device 100 overall. For the above, the processor 120 may include a central processing unit (CPU), or the like and may control operations of various hardware included in the processor 150 by executing a software program according to at least one instruction stored in memory (not shown). The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions.

For example, the processor 120 may perform an operation corresponding to a level of a detection signal output from the power detection IC 110.

For example, the processor 120, if a level of a detection signal output from the power detection IC 110 is the first level, may identify that there is no abnormality in the voltage.

The processor 120, if a level of a detection signal output from the power detection IC 110 is the second level, may identify that there is abnormality in the voltage. In this case, the processor 120 may output a control signal for turning off a power source providing a voltage to the electronic device 100, thereby turning off the power source. Further, the processor 120 may reset the electronic device 100 and reboot the electronic device 100. Still further, the processor 120 may monitor a level of a detection signal output from the power detection IC 110 in a process of rebooting the electronic device 100.

The processor 120 may perform an operation corresponding to a level of a system reset signal output from the power detection IC 110.

For example, the processor 120, if a level of a system reset signal output from the power detection IC 110 is the first level, may identify that there is no abnormality in the voltage VDD for driving the power detection IC 110. Also, the processor 120, if a level of a system reset signal output from the power detection IC 110 is the second level, may identify that there is abnormality in the voltage VDD for driving the power detection IC 110. In this case, the processor 120 may output a control signal for turning off a power source providing a voltage to the electronic device 100, thereby turning off the power source. Further, the processor 120 may reset the electronic device 100 and reboot the electronic device 100.

According to an embodiment of the disclosure, the power detection IC 110 may detect whether a plurality of voltages are abnormal through one input end, wherein it may be described in greater detail below.

Figure 2:
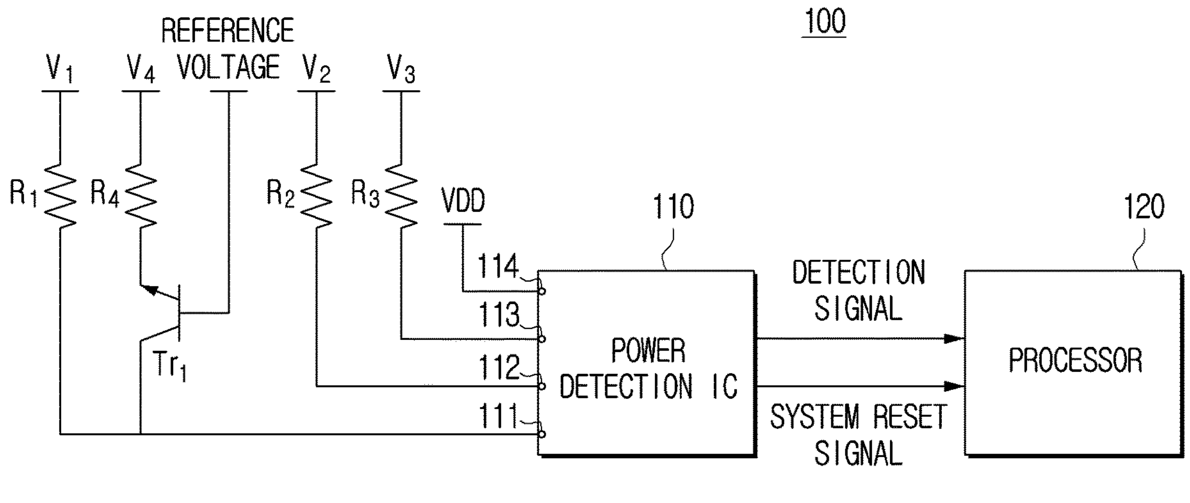
FIGS. 2, 3 and 4 are diagrams illustrating example circuit structures connected to the power detection IC and a method of detecting abnormality of a voltage therefrom according to various embodiments.

FIG. 2 is a diagram illustrating a circuit structure connected to the power detection IC and a method of detecting abnormality of a voltage therefrom according to various embodiments.

The power detection IC 110 may include an input end 114. The power detection IC 110 may receive a voltage VDD for driving the power detection IC 110 through the input end 114.

The power detection IC 110, if abnormality of at least one voltage of a plurality of voltages is detected, may output a detection signal having a preset level.

A plurality of voltages may include a first voltage and a second voltage.

For example, each of a plurality of input ends 111, 112, 113 of the power detection IC 110 may be connected to a first resistance to which a first voltage is applied. At least one of the plurality of input ends 111, 112, 113 of the power detection IC 110 may be commonly connected to a first resistance to which a first voltage is applied and a switching element connected to a second resistance to which a second voltage is applied.

For example, each of the plurality of input ends 111, 112, 113 may be connected to a first resistance (e.g., resistances R1, R2, R3). For convenience of the description, the resistances connected to the plurality of input ends 111, 112, 113 are referred to as the first resistance in the same name but these are different resistances. Resistance values of these may be identical or different.

The first voltage may be voltages V1, V2, V3 applied to the first resistance connected to each of the plurality of input ends 111, 112, 113. For convenience of the description, the voltages applied to the first resistance are referred to as a first voltage in the same name but these are different types of voltages. For example, different voltages among voltages used for driving the electronic device 100 may be applied to the first resistance.

The first resistance and the switching element may be commonly connected to at least one input end. The switching element may be connected to the second resistance. The second voltage may be applied to the second resistance. For example, the resistance (e.g., R1) and a switching element Tr1 may be commonly connected to the input end 111 and a voltage V4 may be applied to a resistance R4 connected to the switching element Tr1. For convenience of the description, a plurality of resistances connected to a plurality of switching elements are referred to as the second resistance in the same name but these are different resistances. Resistance values of these may be identical or different. For convenience of the description, the voltages applied to the second resistance are referred to as a second voltage in the same name but these are different types of voltages and are different from the first voltage. For example, different voltages among voltages used for driving the electronic device 100 may be applied to the first resistance and the second resistance.

The first voltage is applied to one end of the first resistance. The second voltage is applied to one end of the second resistance. A first end of the switching element is connected to the other end of the second resistance, a second end of the switching element receives a reference voltage, a third end of the switching element is commonly connected to the other end of the first resistance and at least one input end. For example, if the switching element is a BJT, the first end is an emitter, the second end is a base, and the third end is a collector. As another example, if the switching element is MOSFET, the first end is a source, the second end is a gate, and the third end is a drain.

The power detection IC 110 may compare a voltage of at least one input end among the plurality of input ends 111, 112, 113 to a threshold voltage. Further, the power detection IC 110, if a voltage of the plurality of input ends 111, 112, 113 is equal to or greater than the threshold voltage, may output a detection signal having the first level. The power detection IC 110, if a voltage of at least one input end of the plurality of input ends 111, 112, 113 is less than a threshold voltage, may output a detection signal having the second level.

A method in that the power detection IC 110 detects abnormality of a voltage and outputs a detection signal corresponding thereto is described in greater detail below.

For example, the power detection IC 110, if a first voltage is lower than a threshold voltage, may output a detection signal having a preset level. The preset level may be the second level.

According to an embodiment of the disclosure, a magnitude of a reference voltage applied to the switching element may be set in consideration of a magnitude of a voltage applied to a resistance connected to the switching element. For example, the magnitude of the reference voltage may be the same as the magnitude of the voltage applied to the resistance. Accordingly, if the magnitude of the voltage applied to the resistance is not lowered but is maintained, there is no difference of voltages between the second end and the first end of the switching element, wherein the switching element may be in an off state.

For example, if the switching element Tr1 is in the off state, it may be considered that only the resistance R1 is connected to the input end 111. Meanwhile, the resistances R2, R3 are connected to the input ends 112, 113.

In this case, the voltages V1, V2, V3 applied to the resistances R1, R2, R3 may be applied by an internal design of the power detection IC 110 to the input ends 111, 112, 113, respectively. Accordingly, the power detection IC 110 may compare the voltages V1, V2, V3 of the plurality of input ends 111, 112, 113 to detect whether the voltages V1, V2, V3 are smaller than a threshold voltage. Here, the threshold voltage may be a voltage preset in the power detection IC 110.

Further, the power detection IC 110, if the voltages V1, V2, V3 of the plurality of input ends 111, 112, 113 are is equal to or greater than the threshold voltage, may output a detection signal having the first level. The power detection IC 110, if at least one voltage of the voltages V1, V2, V3 of the plurality of input ends 111, 112, 113 is less than a threshold voltage, may output a detection signal having the second level.

If the switching element is turned on based on the second voltage and a reference voltage applied to the switching element, the power detection IC 110 may compare the second voltage applied to the at least one input end to a threshold voltage to detect whether the second voltage is abnormal.

For example, if the second voltage is less than the reference voltage, the switching element may be turned on. In this case, the power detection IC 110, if a second voltage is lower than a threshold voltage, may output a detection signal having a preset level. The preset level may be the second level.

For example, if there is abnormality in the voltage applied to a resistance connected to the switching element and a magnitude of the voltage becomes smaller, a magnitude of the voltage of the first end of the switching element becomes smaller and thus, a difference of voltages of the first end and the second end of the switching element occurs. Further, if the difference of voltages becomes greater than the threshold voltage of the switching element, the switching element may be turned on. Accordingly, the first resistance and the second resistance may be commonly connected to the input end.

For example, if a magnitude of the voltage V4 becomes lower, the switching element Tr1 may be turned on and the resistance R1 and the resistance R4 may be commonly connected to the input end 111.

In this case, a relatively small voltage among the voltage V1 applied to the resistance R1 and the voltage V4 applied to the resistance R4 may be applied by an internal design of the power detection IC 110 to the input end 111. It may be that a voltage lower than the voltage applied to the first resistance is applied to the second resistance. For example, a voltage of a relatively small magnitude among voltages used for driving the electronic device 100 may be applied to the second resistance.

Accordingly, the voltage V4 is applied to the input end 111, wherein the power detection IC 110 may compare the voltage V4 of the input end 111 to the threshold voltage to detect whether the voltage V4 is less than the threshold voltage. The threshold voltage may be a voltage preset in the power detection IC 110.

The power detection IC 110, if the voltage V4 of the input end 111 is the threshold voltage or more, may output a detection signal having the first level. The power detection IC 110, if the voltage V4 of the input end 111 is less than the threshold voltage, may output a detection signal having the second level. The switching element is not connected to the input ends 112, 113. In this case, the power detection IC 110 may compare the voltages V2, V3 of the input ends 112, 113 to detect whether there is abnormality in the voltages V2, V3.

As above, according to an embodiment of the disclosure, whether there is abnormality with respect to one or more voltages per input end may be detected by adding an additional circuit (e.g., a switching element and a resistance) to the input end of the power detection IC 110. Accordingly, whether the additional voltage is abnormal may be detected without increasing the number of the detection circuit ICs, thereby reducing costs.

For example, it is assumed that the reference voltage V1 (=13 V) for generating a voltage to drive a display panel is applied to the resistance R1, the voltage V2 (=18 V) for driving the amplifier to generate sound is applied to the resistance R2, the voltage V3 (=5 V) used in a USB is applied to the resistance R3, and the reference voltage V4 (=3.3 V) for I/O communication is applied to the resistance R4. Further, it is assumed that the threshold voltage set in the power detection IC 110 is 4 V.

The reference voltage for generating a voltage to drive the display panel and the voltage for driving the amplifier to generate sound have a relatively large voltage value compared to the threshold voltage. In this case, the relevant voltages are distributed by a voltage distribution circuit (not shown), respectively and a voltage of 5 V may applied to the resistance R1 and the resistance R2.

In this case, the power detection IC 110, if at least one of a voltage applied to the resistance R1, a voltage applied to the resistance R2, or a voltage applied to the resistance R3 is smaller than the threshold voltage, may output a detection signal having the second level. If the threshold voltage of the switching element Tr1 is 0.7 V and the voltage applied to the resistance R4 is lowered to 3.3 V, the switching element Tr1 is turned on and 3.3 V may be applied to the input end 111. Accordingly, the power detection IC 110, if the voltage of the input end 111 is smaller than the threshold voltage, may output a detection signal having the second level.

It is shown in FIG. 2 that the switching element is connected to one input end but it is merely an example. For example, according to an embodiment of the disclosure, the switching element may be connected to each of multiple input ends and the second resistance to which the second voltage is applied may be connected to each switching element.

For example, each of a plurality of input ends may be commonly connected to the first resistance to which the first voltage is applied and a switching element connected to the second resistance to which the second voltage is applied. If the switching element is turned on based on the second voltage and a reference voltage applied to the switching element, the power detection IC 100 may compare the second voltage applied to the plurality of input ends to a threshold voltage to detect whether the second voltage is abnormal.

Figure 3:
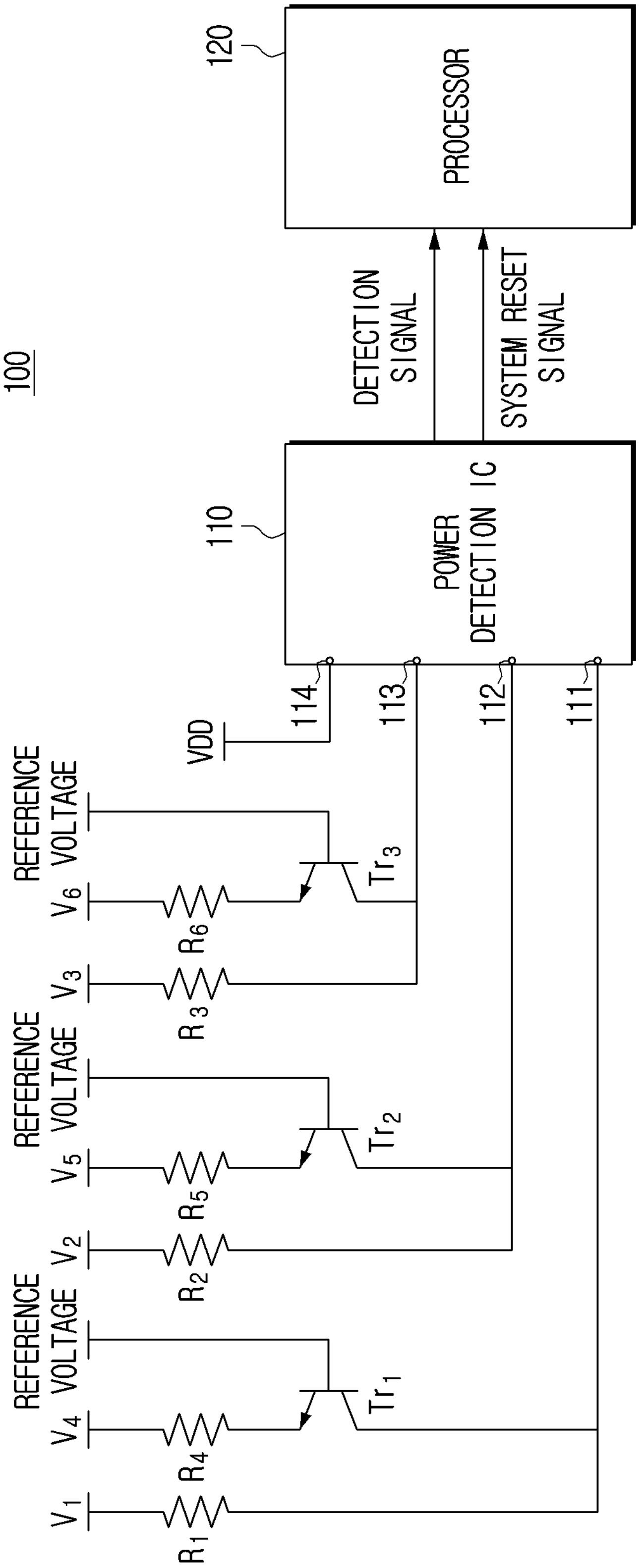

For example, as shown in FIG. 3, the resistance R1 and the switching element Tr1 may be commonly connected to the input end 111 and the voltage V4 may be applied to the resistance R4 connected to the switching element Tr1. The resistance R2 and the switching element Tr2 may be commonly connected to the input end 112 and the voltage V5 may be applied to the resistance R5 connected to the switching element Tr2. The resistance R3 and the switching element Tr3 may be commonly connected to the input end 113 and the voltage V6 may be applied to the resistance R6 connected to the switching element Tr3.

In this case, the power detection IC 110, if a magnitude of the voltages V4, V5, V6 becomes lower and the switching elements Tr1, Tr2, Tr3 are turned on, may compare the voltages V4, V5, V6 applied to the plurality of input ends 111, 112, 113 to the threshold voltage to detect whether the voltages V4, V5, V6 are abnormal.

It is described in the aforementioned embodiments that one switching element is connected to the input end but it is merely an example. That is, according to an embodiment of the disclosure, a plurality of switching elements may be connected to the input end and the second resistance to which the second voltage is applied may be connected to each switching element.

Figure 4:
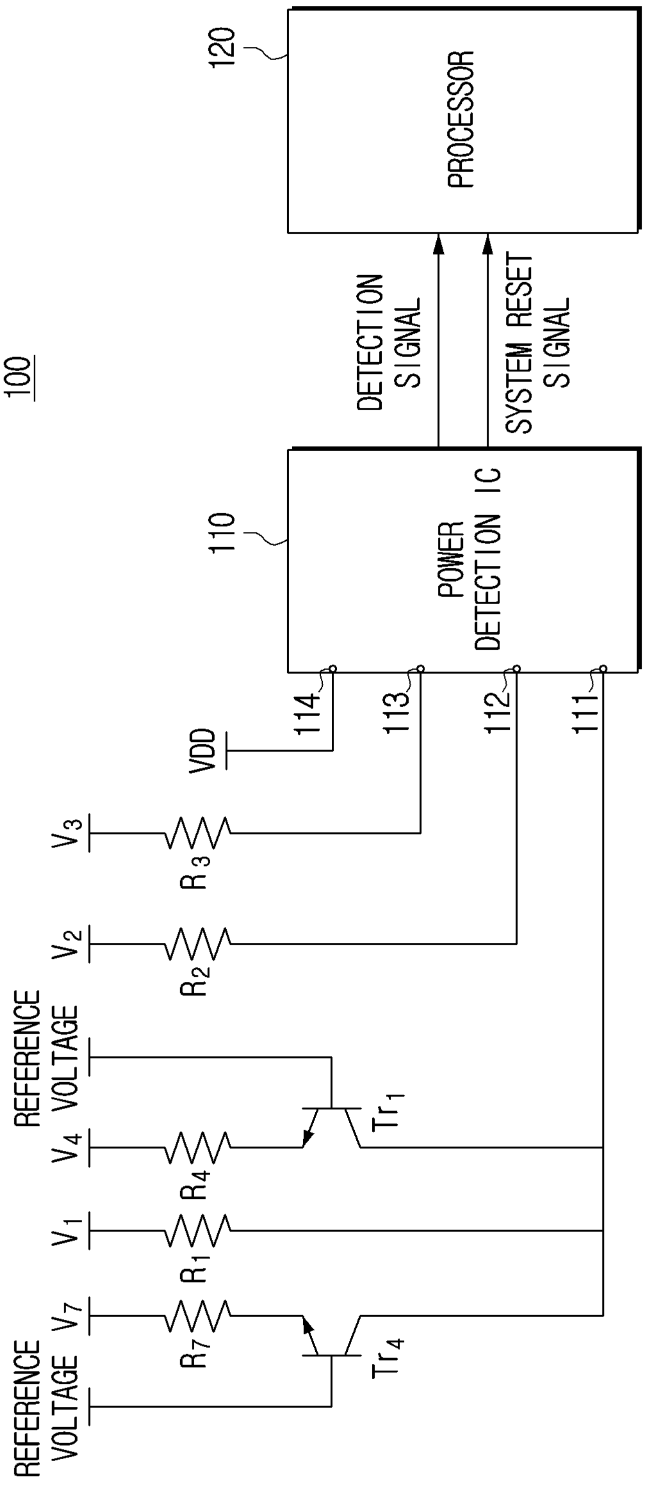

For example, as shown in FIG. 4, the resistance R1, the switching element Tr1, the switching element Tr4 may be commonly connected to the input end 111 and the voltage V4 may be applied to the resistance R4 connected to the switching element Tr1, and the voltage V7 may be applied to the resistance R7 connected to the switching element Tr4.

In this case, the power detection IC 110, if a magnitude of the voltage V4 becomes less and the switching element Tr1 is turned on, may compare the voltage V4 applied to the input end 111 to the threshold voltage to detect whether the voltage V4 is abnormal. The power detection IC 110, if a magnitude of the voltage V7 becomes smaller and the switching element Tr4 is turned on, may compare the voltage V7 applied to the input end 111 to the threshold voltage to detect whether the voltage V7 is abnormal.

It is shown in FIG. 4 that a plurality of switching elements are connected to one input end. Meanwhile, it is merely an embodiment, wherein the plurality of switching elements may be connected to each of multiple input ends and the second resistance to which the second voltage is applied may be connected to each switching element.

Figure 5:
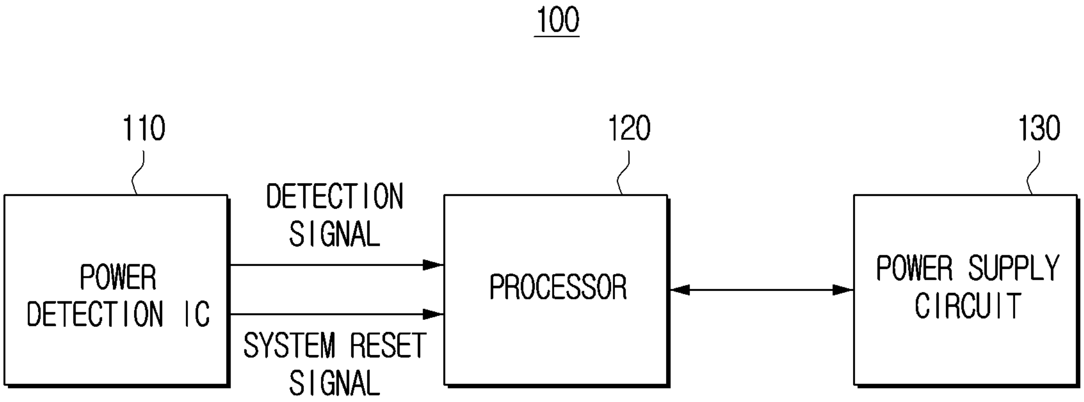
FIG. 5 is a block diagram illustrating an example configuration of an electronic device according to various embodiments.

FIG. 5 is a block diagram illustrating an example configuration of an electronic device according to various embodiments.

With reference to FIG. 5, the electronic device 100 may include not only the power detection IC 110 and the processor 120 but also a power supply circuit 130. However, the above configuration is merely an example, wherein it will be apparent that upon implementing the disclosure, a new configuration may be added to the above configuration or part of the configuration may be omitted. In describing FIG. 5, the description overlapping with that of FIGS. 1 to 4 may not be repeated.

The power supply circuit 130 may generate a voltage used for driving the electronic device 100. The voltage may include a voltage provided to various configurations included in the electronic device 100. For the above, the power supply circuit 130 may include a switched mode power supply (SMPS). That is, the power supply circuit 130 may convert an alternating current (AC) voltage provided from an outside to a direct current (DC) voltage using a switching transistor or the like and may generate a voltage used for driving the electronic device 100 using the converted DC voltage.

Figure 6:
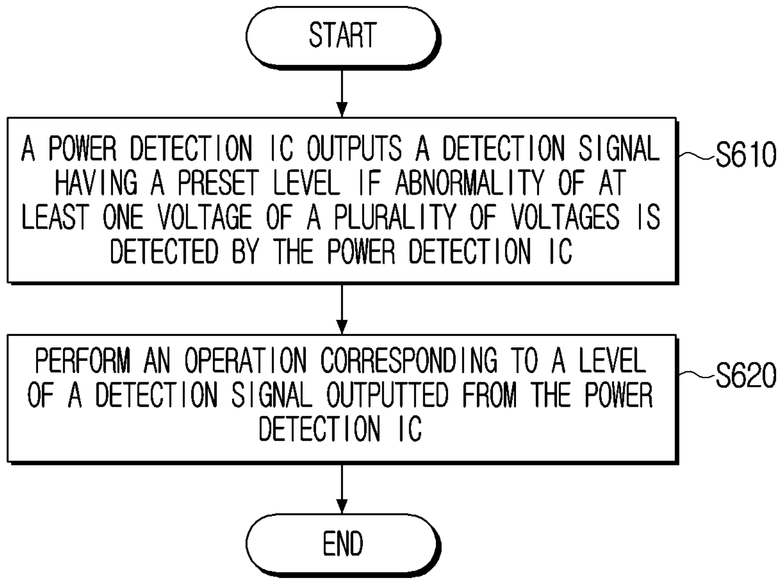
FIG. 6 is a flowchart illustrating an example method of detecting a voltage according to various embodiments.

FIG. 6 is a flowchart illustrating an example method of detecting a voltage of an electronic device according to various embodiments.

A power detection IC outputs a detection signal having a preset level if abnormality of at least one voltage of a plurality of voltages is detected by the power detection IC (S610).

Further, an operation corresponding to a level of the detection signal is performed (S620).

The plurality of voltages includes a first voltage and a second voltage. Further, at least one of a plurality of input ends of the power detection IC may be commonly connected to the first resistance to which the first voltage is applied and a switching element connected to a second resistance to which the second voltage is applied.

If the switching element is turned on based on the second voltage and a reference voltage applied to the switching element, the step S610 may compare the second voltage applied to the at least one input end to a threshold voltage to detect whether the second voltage is abnormal.

The first voltage is applied to one end of the first resistance. The second voltage is applied to one end of the second resistance. A first end of the switching element is connected to the other end of the second resistance, a second end of the switching element receives a reference voltage, a third end of the switching element is commonly connected to the other end of the first resistance and at least one input end.

The step S610 may include outputting the detection signal of the preset level if the first voltage is smaller than the threshold voltage.

If the second voltage becomes less than the reference voltage, the switching element may be turned on.

The step S610 may include outputting the detection signal of the preset level based on the second voltage being smaller than the threshold voltage.

Each of a plurality of input ends may be commonly connected to the first resistance to which the first voltage is applied and a switching element connected to the second resistance to which the second voltage is applied, and if the switching element is turned on based on the second voltage and the reference voltage applied to the switching element, the step S610 may compare the second voltage applied to the plurality of input ends to a threshold voltage to detect whether the second voltage is abnormal.

Each of plurality of voltages may be a voltage for driving the electronic device.

A method in which the power detection IC detects whether a voltage is abnormal was described.

A non-transitory computer readable medium storing a program sequentially performing a method according to the disclosure may be provided.

A machine readable storage medium may be provided in a form of a non-transitory storage medium. Here, the term 'non-transitory storage medium' is a tangible device and may not include a signal (e.g. an electromagnetic wave), wherein the term does not distinguish a case where data is stored semi-permanently in the storage medium and a case where data is stored temporarily therein. For example, the 'non-transitory storage medium' may include a buffer where data is temporarily stored.

According to an embodiment, a method according to various examples disclosed in the disclosure may be provided to be included in a computer program product. The computer program product may be traded between a seller and a buyer as goods. The computer program product may be distributed in a form of the machine-readable storage medium (e.g. compact disc read only memory (CD-ROM)) or may be distributed (e.g. downloaded or uploaded) on-line via an application store or directly between two user devices (e.g. smart phones). In the case of the on-line distribution, at least part of the computer program product (e.g. a downloadable app) may be stored at least temporarily or may be generated temporarily in the machine-readable storage media such as memory of a server of a manufacturer, a server of an application store, or a relay server.

Each of the components (e.g. a module or a program) according to the various embodiments of the disclosure as above may be configured as a single item or a plurality of items, wherein partial subcomponents of the aforementioned relevant subcomponents may be omitted or another subcomponent may be further included in various embodiments. Mostly or additionally, some components (e.g. a module or a program) may be integrated into one item and may identically or similarly perform a function implemented by each of the relevant components before the integration.

According to various embodiments, operations performed by a module, a program, or another component may be executed sequentially, in parallel, repetitively, or heuristically, at least part of the operations may be executed in different orders or be omitted, or another operation may be added.

Meanwhile, the term "part" or "module" used in the disclosure may include a unit configured of hardware, software, or firmware and may be interchangeably used with the term, for example, logic, a logic block, a part, a circuit, or the like. The term "part" or "module" may be an integrally configured component or a minimum unit or its part performing one or more functions. For example, the module is configured as an application-specific integrated circuit (ASIC).

The various examples of the disclosure may be implemented as software including instructions stored in the machine-readable storage media, which can be read by the machine (e.g. a computer). The machine may refer to a device which calls instructions stored in the storage media and is operable according to the called instructions, wherein it may include an electronic device according to the disclosed embodiments.

If the aforementioned instructions are executed by a processor, the processor may perform a function corresponding to the instructions directly or using the other components under control of the processor. The instructions may include a code generated or executed by a compiler or an interpreter.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device, comprising:

a power detection integrated circuit (IC) configured to output a detection signal having a specified level based on abnormality of at least one voltage of a plurality of voltages being detected; and at least one processor, comprising processing circuitry, individually and/or collectively, configured to perform an operation corresponding to a level of the detection signal output from the power detection IC, wherein the plurality of voltages include a first voltage and a second voltage, wherein at least one of a plurality of input ends of the power detection IC is commonly connected to a first resistance to which the first voltage is applied and a switching element comprising a switch connected to a second resistance to which the second voltage is applied, and wherein based on the switching element being turned on based on the second voltage and a reference voltage applied to the switching element, the power detection IC compares the second voltage applied to the at least one of the plurality of input ends of the power detection IC to a threshold value to detect whether the second voltage is abnormal.

2. The method of claim 1, wherein the first voltage is applied to one end of the first resistance, wherein one end of the second resistance is applied to the second voltage, and wherein a first end of the switching element is connected to an other end of the second resistance, a second end of the switching element receives the reference voltage, a third end of the switching element is commonly connected to an other end of the first I resistance and the at least one of the plurality of input ends of the power detection IC.

3. The method of claim 1, wherein the power detection IC is configured to:

output the detection signal of the specified level based on the first voltage being less than the threshold voltage.

4. The method of claim 1, wherein the switching element is turned on based on the second voltage being less than the reference voltage.

5. The method of claim 4, wherein the power sensing IC is configured to:

output the detection signal of the specified level based on the second voltage being less than the threshold voltage.

6. The method of claim 1, wherein each of a plurality of input ends is commonly connected to the first resistance to which the first voltage is applied and a switching element comprising a switch connected to the second resistance to which the second voltage is applied, and wherein based on the switching element being turned on based on the second voltage and the reference voltage applied to the switching element, the power detection IC is configured to compare the second voltage applied to the plurality of input ends to a threshold value to detect whether the second voltage is abnormal.

7. The method of claim 1, wherein each of the plurality of voltages is a voltage for driving the electronic device.

8. A method of detecting a voltage of an electronic device, comprising:

outputting a detection signal having a specified level by a power detection IC based on abnormality of at least one voltage of a plurality of voltages being detected by the power detection IC; and performing an operation corresponding to a level of the detection signal output from the power detection IC, wherein the plurality of voltages include a first voltage and a second voltage, wherein at least one of a plurality of input ends of the power detection IC is commonly connected to a first resistance to which the first voltage is applied and a switching element comprising a switch connected to a second resistance to which the second voltage is applied, and wherein based on the switching element being turned on based on the second voltage and a reference voltage applied to the switching element, the outputting compares the second voltage applied to the at least one of the plurality of input ends of the power detection IC to a threshold value to detect whether the second voltage is abnormal.

9. The method of claim 8, wherein the first voltage is applied to one end of the first resistance, wherein one end of the second resistance is applied to the second voltage, and wherein a first end of the switching element is connected to an other end of the second resistance, a second end of the switching element receives the reference voltage, a third end of the switching element is commonly connected to the other end of the first resistance and the at least one of the plurality of input ends of the power detection IC.

10. The method of claim 8, wherein the outputting includes:

outputting the detection signal of the specified level based on the first voltage being less than the threshold voltage.

11. The method of claim 8, wherein the switching element is turned on based on the second voltage being less than the reference voltage.

12. The method of claim 11, wherein the outputting includes:

outputting the detection signal of the specified level based on the second voltage being less than the threshold voltage.

13. The method of claim 8, wherein each of a plurality of input ends is commonly connected to the first resistance to which the first voltage is applied and a switching element comprising a switch connected to the second resistance to which the second voltage is applied, and wherein based on the switching element being turned on based on the reference voltage applied to the second voltage and the switching element, the outputting includes comparing the second voltage applied to the plurality of input ends to a threshold value to detect whether the second voltage is abnormal.

14. The method of claim 8, wherein each of the plurality of voltages is a voltage for driving the electronic device.

* * * * *